(12) United States Patent
Ko et al.

(10) Patent No.: US 7,321,155 B2
(45) Date of Patent: Jan. 22, 2008

(54) OFFSET SPACER FORMATION FOR STRAINED CHANNEL CMOS TRANSISTOR

(75) Inventors: Chih-Hsin Ko, Fongshan (TW); Wen-Chin Lee, Hsin-chu (TW); Chung-Hu Ge, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/840,911

(22) Filed: May 6, 2004

(65) Prior Publication Data

US 2005/0247986 A1 Nov. 10, 2005

(51) Int. Cl.
*H01L 29/772* (2006.01)
(52) U.S. Cl. ................ 257/408; 257/900; 257/E29.266
(58) Field of Classification Search ........ 257/E29.193, 257/391, 392, 344, 409, 900, 336, 408, E29.266
See application file for complete search history.

(56) References Cited

U.S. PATENT DOCUMENTS

| | | | |
|---|---|---|---|
| 6,797,572 B1 * | 9/2004 | Jeon et al. .................. 438/287 |
| 6,825,529 B2 * | 11/2004 | Chidambarrao et al. .... 257/336 |
| 6,867,433 B2 * | 3/2005 | Yeo et al. ...................... 257/67 |
| 6,870,179 B2 * | 3/2005 | Shaheed et al. ............... 257/29 |
| 7,001,837 B2 * | 2/2006 | Ngo et al. ................... 438/634 |
| 2003/0181005 A1 * | 9/2003 | Hachimine et al. ......... 438/231 |
| 2004/0262784 A1 * | 12/2004 | Doris et al. ................. 257/900 |

* cited by examiner

*Primary Examiner*—Matthew C. Landau
(74) *Attorney, Agent, or Firm*—Tung & Associates

(57) ABSTRACT

A strained channel transistor and method for forming the same, the strained channel transistor including a semiconductor substrate; a gate dielectric overlying a channel region; a gate electrode overlying the gate dielectric; source drain extension (SDE) regions and source and drain (S/D) regions; wherein a stressed dielectric portion selected from the group consisting of a pair of stressed offset spacers disposed adjacent the gate electrode and a stressed dielectric layer disposed over the gate electrode including the S/D regions is disposed to exert a strain on a channel region.

25 Claims, 4 Drawing Sheets

OFFSET SPACER FORMATION FOR STRAINED CHANNEL CMOS TRANSISTOR

FIELD OF THE INVENTION

This invention generally relates to formation of CMOS devices in integrated circuit manufacturing processes and more particularly to CMOS devices including strained channel transistors and offset spacer formation methods to enhance mechanical stresses on a channel region to improve device performance.

BACKGROUND OF THE INVENTION

Mechanical stresses are known to play a role in charge carrier mobility which affects Voltage threshold and drive current ($I_d$). The effect of induced strain in a channel region of a CMOS device by mechanical stresses affects several critical device performance characteristics including drive current ($I_d$) and particularly drive current saturation levels ($I_{Dsat}$), believed to be related to alteration in charge carrier mobilities caused by complex physical processes such as acoustic and optical phonon scattering.

Biaxial in-plane tensile strain induced by Si/SiGe lattice mismatch has been successfully introduced for both bulk silicon and silicon on insulator (SOI) CMOS devices. However, several shortcomings are associated with this approach including issues such as cost and process integration issues related to scalability and acceptable manufacture and performance of conventional structures such as shallow trench isolation (STI) structures.

On the other hand, conventional bulk silicon CMOS manufacturing processes are known to introduce stress into the CMOS device channel region, and such stress enhancement becomes more effective as device sizes decrease. For example, stress is typically introduced into the channel region by formation of an overlying polysilicon gate structure including offset spacers and silicide formation processes. One problem with conventional stress inducing processes, however, is related to ion implantation and annealing processes following formation of the gate structure which typically alter the stresses introduced by previous processes, frequently causing stress relaxation and degrading device performance. Prior art attempts to increase stresses by high levels of ion implantation into the gate electrode structure, for example prior to spacer formation have the shortcoming of causing damage to the gate dielectric thereby degrading CMOS device stability and reliability.

Prior art processes have also attempted to introduce mechanical stresses into the channel region by forming a stressed contact etching stop layer over the polysilicon gate structure including offset spacers. In this approach, the degree of stress induced in the channel region is limited by the size of the offset spacer which is dictated by design requirements of source/drain formation. For example the offset spacers act as a buffer between the stressed contact etching stop layer and the channel region, limiting the degree of stress which can be introduced into the channel region. Other problems with prior art channel stressing techniques include the opposing effects of the type of stress introduced on NMOS and PMOS devices. For example, tensile stress introduction into the channel region improves NMOS performance while degrading PMOS performance, while compressive stress has the opposite effect. As a result, unacceptable trade-offs between NMOS and PMOS performances are frequently required in prior art stress inducing techniques.

Some efforts in the prior art that have been proposed to overcome the device degradation of a CMOS of opposite polarity have included ion implanting the contact etching stop layer overlying the opposite polarity device with Ge ions to relax the stress in the contact etch stop layer. For example, nitride contact etch stop layers of the prior art have been formed with a relatively high level of tensile stress requiring a high level of ion implantation to relax the stress of selected polarity devices. As a result, the nitride contact etching stop layer is severely damaged, which can have the effect of undesirably changing etching rates and causing unintentional overetching in subsequent processes, for example causing damage to underlying silicon or polysilicon portions of a CMOS device, thereby degrading device performance and reliability.

These and other shortcomings demonstrate a need in the semiconductor device integrated circuit manufacturing art for improved CMOS devices and manufacturing methods to enhance and improve local mechanical stress levels introduced into CMOS device channel regions to improve device performance and reliability.

It is therefore an object of the present invention to provide improved CMOS devices and manufacturing methods to enhance and improve local mechanical stress levels introduced into CMOS device channel regions to improve device performance and reliability, in addition to overcoming other shortcomings of the prior art.

SUMMARY OF THE INVENTION

To achieve the foregoing and other objects, and in accordance with the purposes of the present invention, as embodied and broadly described herein, the present invention provides a strained channel transistor to improve channel charge carrier mobility and method for forming the same.

In a first embodiment, the strained channel transistor includes a semiconductor substrate; a gate dielectric overlying a channel region; a gate electrode overlying the gate dielectric; source drain extension (SDE) regions and source and drain (S/D) regions; wherein a stressed dielectric portion selected from the group consisting of a pair of stressed offset spacers disposed adjacent the gate electrode and a stressed dielectric layer disposed over the gate electrode including the S/D regions is disposed to exert a strain on a channel region.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to an exemplary CMOS device (strained channel transistor), it will be appreciated that the method of the present invention may be applied to the formation of any transistor where either a local tensile or compressive stress is controllably introduced to form a strained channel region to achieve device performance improvement including increased charge carrier mobility.

Figure 1A:
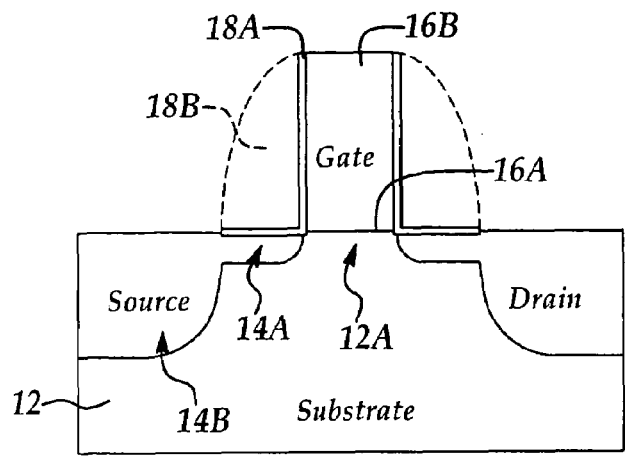
FIGS. 1A-1F are cross sectional schematic representations of an exemplary CMOS semiconductor device at stages of manufacture according to an embodiment of the present invention.

Referring to FIGS. 1A-1F in an exemplary embodiment of the method of the present invention, are shown cross-sectional schematic views of a portion of a semiconductor wafer during stages in production of a CMOS structure (strained channel transistor) according to an embodiment of the invention. For example, referring to FIG. 1A is shown an exemplary CMOS semiconductor device. Shown is a semiconductor substrate 12 including an active channel region 12A, source/drain extension regions e.g., 14A and source/drain regions e.g., 14B, gate dielectric 16A, gate electrode 16B, gate liner e.g., 18A and offset spacer 18B. The semiconductor substrate 12 may be formed of silicon, silicon on insulator (SOI), strained silicon, and silicon-germanium (SiGe), or combinations thereof.

Still referring to FIG. 1A, gate structures including a gate dielectric portion e.g., 16A and gate 16B may be formed by conventional CVD deposition, lithographic patterning, and plasma and/or wet etching methods known in the art. Preferably, the gate dielectric portion e.g., 16A may be formed by any process known in the art, e.g., thermal oxidation, nitridation, sputter deposition, or chemical vapor deposition. The physical thickness of the gate dielectric may vary depending on the scaling design constraints, but is preferably in the range of 5 to 100 Angstroms. The gate dielectric may be formed of silicon oxide, silicon nitride, silicon oxynitride, a high-K dielectric, or combination thereof. When using a high permittivity (high-K) dielectric, preferably the dielectric constant is greater than about 8. The high-K dielectric may include transition metal oxides or rare earth oxides, for example including aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof. The silicon oxide equivalent oxide thickness (EOT) of the gate dielectric is preferably less than about 50 Angstroms, more preferably less than about 20 Angstroms, and even more preferably less than about 15 Angstroms.

The gate electrode e.g., 16B may be formed of doped polysilicon, polysilicon-germanium, metals, metal silicides, metal nitrides, or conductive metal oxides. In a preferred embodiment, the gate electrode is formed of doped polysilicon. Metals such as molybdenum, tungsten, titanium, tantalum, platinum, and hafnium may be used in an upper portion of the gate electrode e.g., 16B. Metal nitrides may include, but are not limited to, molybdenum nitride, tungsten nitride, titanium nitride, and tantalum nitride. Conductive metal oxides may include, but are not limited to, ruthenium oxide and indium tin oxide.

The gate electrode 16B material may be deposited by conventional techniques such as CVD methods. A patterned gate hardmask is then formed on the gate electrode material using conventional deposition and photolithographic techniques. The gate hardmask may employ commonly used masking materials such as, but not limited to, silicon oxide, silicon oxynitride, and silicon nitride. The gate material is then etched according to the gate mask using a plasma etch process to form the gate electrode, e.g., 16B.

Conventional source/drain extension (SDE) regions e.g., 14A are formed by a conventional ion implant process adjacent the gate electrodes to a shallow depth e.g., (30 to 100 nm) in the semiconductor substrate 12 prior to offset spacer and/or offset liner formation.

Still referring to FIG. 1A, offset spacers, also referred to as sidewall spacers, e.g., 18B and optionally including an offset liner e.g., 18A, are formed adjacent the gate electrode 16B sidewalls by depositing one or more offset dielectric layers. For example, an LPCVD or PECVD process may be used and/or a thermal or plasma growth process over polysilicon, e.g., oxide, nitride or oxynitride growth over polysilicon. The offset spacers may be formed of silicon oxide, silicon oxynitride, silicon nitride, or combinations thereof. For example, the offset spacers may be formed of oxide, oxide/nitride, nitride/oxide, oxide/nitride/oxide, or nitride/oxide/nitride layers by first depositing dielectric layers followed by etching away portions of the dielectric layers to form offset spacers e.g., 18B and/or offset liners e.g., 18A on either side of the gate electrode 16B and on opposing sides of the channel region 12A.

Following offset spacer formation, the semiconductor substrate 12 is doped according to a conventional a high dose ion implantation (HDI) process to form source and drain (S/D) regions e.g., 14B in the silicon substrate adjacent the offset spacers e.g., 18B. The gate electrode is preferably doped at the same time the HDI is carried out to lower a sheet resistance of the gate electrode material.

Figure 1B:
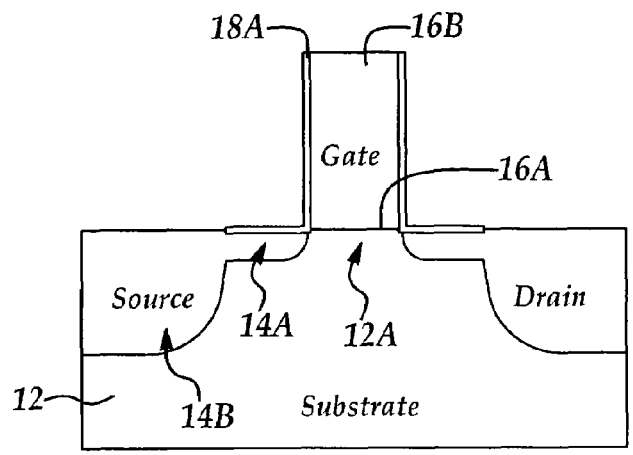

Referring to FIG. 1B, following the S/D region formation process, the offset spacers 18B are removed according to a dry and/or wet etching process, to leave the first pair of offset liners 18A in place.

Figure 1C:
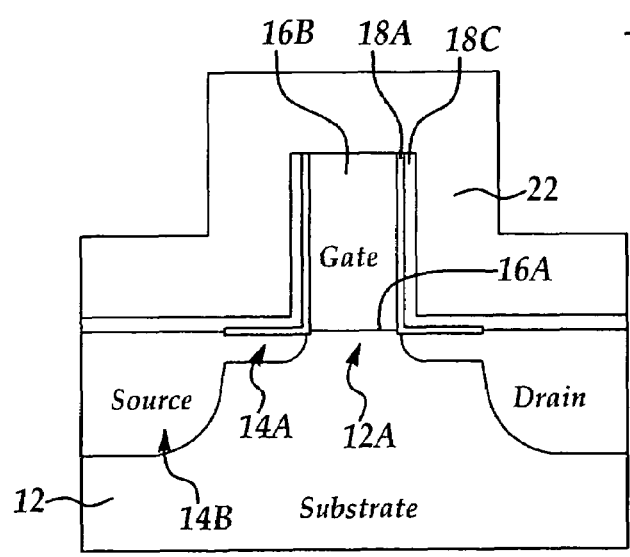

Referring to FIG. 1C, a second pair of offset liner layers e.g., 18C formed of the same or different preferred materials as the first pair of offset liners e.g., 18A, for example silicon oxide, silicon oxynitride, or silicon nitride are formed by conventional CVD deposition process, e.g., LPCVD or PECVD followed by dry and/or wet etchback processes. One or more dielectric layer spacer layers e.g., 22 are then deposited over the second pair of offset liners 18C, preferably formed of silicon oxide, silicon oxynitride, silicon nitride, or combinations thereof to have a different etching selectivity compared to the second pair of offset liners e.g., 18C.

For example, the first and second pair of offset liners 18A and 18C may form a nitride/oxide layer and dielectric spacer layer 22 formed of silicon nitride or silicon oxynitride to form stressed offset spacers shown below. For example, preferably an LPCVD, PECVD or atomic layer CVD (AL-CVD) process is carried out using silane and/or chlorosilane precursors such as silane ($SiH_4$), disilane ($Si_2H_6$), trisilane ($Si_3H_8$), dichlorosilane ($SiH_2Cl_2$), trichlorosilane ($SiHCl_3$), hexacholorodisilane ($Si_2Cl_6$), and the like, or mixtures thereof, For example, the spacer dielectric layer 22 is deposited at temperatures from about 500° C. to about 700°

C. to form a stressed dielectric silicon nitride or silicon oxynitride dielectric layer in tensile or compressive stress, where upon being formed, said stress is at a desired level within the spacer dielectric layer (internal stress originating from within the spacer dielectric layer), preferably having a stress up to about 2 GPa. The spacer dielectric layer 22 is preferably formed in tensile stress for NMOS device formation and compressive stress for PMOS device formation.

Figure 1D:
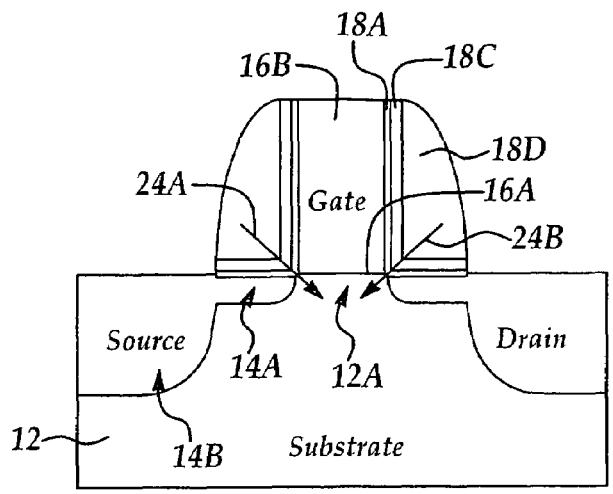

Referring to FIG. 1D, a conventional wet and or dry etching process, preferably a dry etching process, is then carried out to etchback the dielectric spacer layer 22 to form a pair of highly stressed offset spacers e.g., 18D on either side of the gate electrode and on opposing sides of the channel region 12A. Advantageously, a stress represented by stress vectors e.g., 24A and 24B are directed toward the channel region 12A to exert a strain on the channel region to increase charge carrier mobility and improve device performance.

Figure 1E:
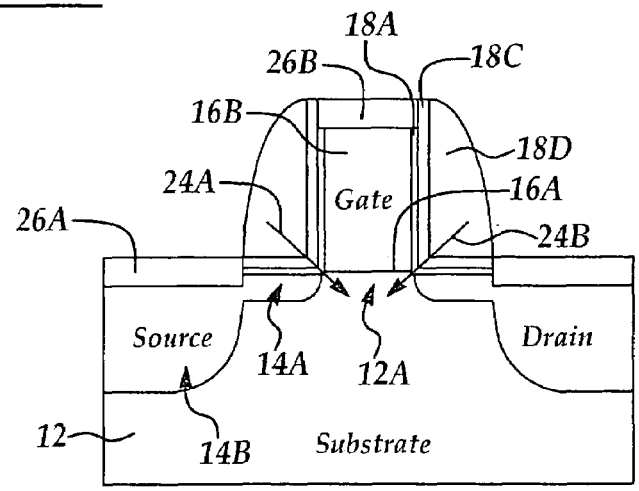

Referring to FIG. 1E, in another embodiment, a conductive material, for example, self aligned silicides (silicides) e.g., 26A are then formed by conventional processes over the S/D regions e.g., 14B and over the upper portion e.g., 26B of the gate electrode 16B. For example, nickel silicide (e.g., $NiSi_2$) or cobalt silicide (e.g., $CoSi_2$) is formed by conventional processes including metal deposition over exposed silicon portions of the S/D regions e.g., 14A and upper gate electrode 16B portion, followed by annealing processes to form the low electrical resistance silicide phase as is known in the art. During the silicide formation process, additional stresses are developed to contribute to the stress vectors e.g., 24A and 24B, further enhancing the strain in the channel region 12A.

Figure 1F:
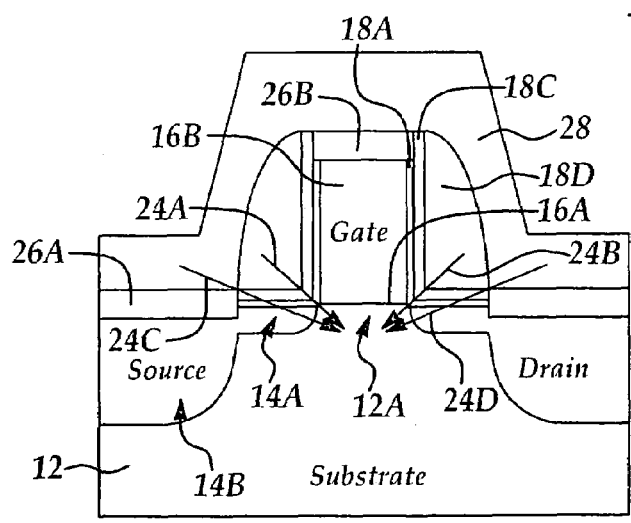

Referring to FIG. 1F, in another embodiment, at least one stressed dielectric layer, also referred to as a contact etch stop layer e.g., 28 is formed over the CMOS device including the gate electrode 16B and offset spacers e.g., 18D, preferably in compressive stress for a PMOS device formation process and in tensile stress for an NMOS device formation process. The stressed dielectric layer 28 may be formed of silicon oxide, silicon nitride, silicon oxynitride, or combinations thereof. In a preferred embodiment, the stressed dielectric layer 28 includes a silicon nitride or silicon oxynitride layer formed by the same processes and having the same preferred stress levels of internal stress as outlined for formation of the offset spacer dielectric layer 22. For example, the CVD process may be a low pressure chemical vapor deposition (LPCVD) process, an atomic layer CVD (ALCVD) process, or a plasma enhanced CVD (PECVD) process. Advantageously, formation of the stressed dielectric layer 28 exerts addition stress e.g., stress vectors e.g., 24C and 24D increasing a strain on the channel region 12A to further enhance charge mobility.

Figure 2:
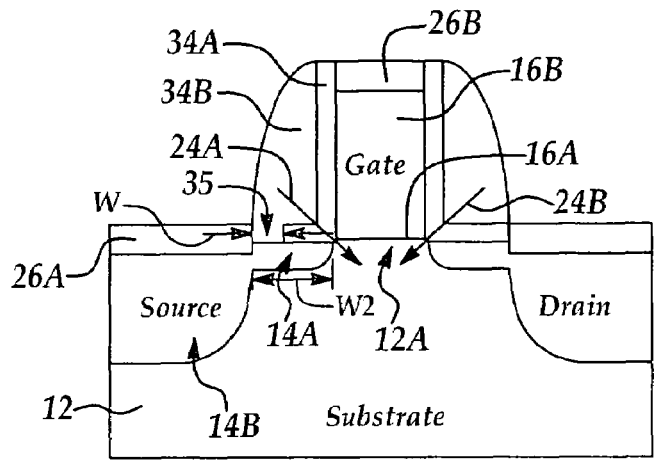
FIG. 2 is a cross sectional schematic representation of an exemplary CMOS semiconductor device at a stage of manufacture according to an embodiment of the present invention.

Referring to FIG. 2, is shown an alternative embodiment for forming the CMOS device (strained channel transistor) with stressed offset spacers as shown in FIG. 1A through 1G. In this embodiment, only one pair of offset liners are shown e.g., 34A, formed prior to formation and removal of a first pair of offset spacers as previously shown in FIG. 1B. Following removal of the first pair of offset spacers and prior to the formation of the second set of highly stressed dielectric spacers e.g., 34B, a portion of the offset liner layer e.g., 34A is removed to expose a portion of the semiconductor substrate e.g., 35, for example, over the SDE region 14A. For example a portion of the width is etched back by a conventional wet and/or dry etching process. For example the exposed region 35 has a width W about equal to about ¼ to about ¾ of a width W2 of the SDE region. The pair of stressed offset spacers e.g., 34B is then formed to include contacting the exposed portion 35 of the semiconductor substrate 12. It will be appreciated that more than one offset liner layer may be present, for example a second liner offset layer formed prior to or following the offset liner 34A etchback process. Advantageously in this embodiment, the portion of the stressed offset spacers e.g., 34B contacting the semiconductor substrate exert a stress e.g., stress vectors 24A and 24B, without the buffering effect of an intervening offset liner layer thereby allowing more efficient transfer of stress to strain the channel region 12A.

Figure 3A:
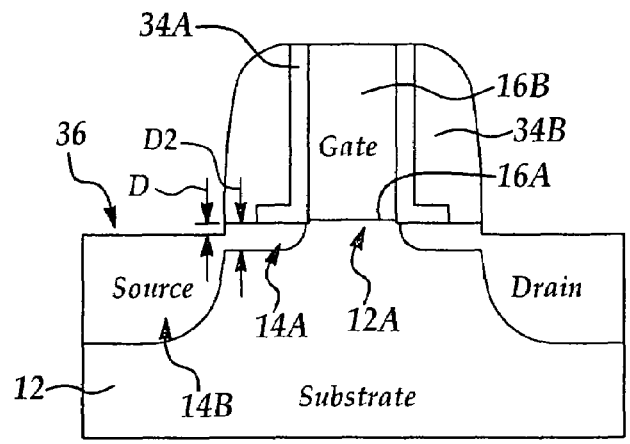
FIGS. 3A-3B are cross sectional schematic representations of an exemplary CMOS semiconductor device at stages of manufacture according to an embodiment of the present invention.

Referring to FIG. 3A, in another alternative embodiment for forming the CMOS device (strained channel transistor) with stressed offset spacers, following formation of the stressed offset spacers e.g., 34B, recessed regions adjacent the offset spacers e.g., 36A overlying S/D regions e.g., 14B are formed, for example by etching into a depth, D of the semiconductor substrate by a conventional wet or dry etching process, including thermal, plasma, or chemical oxidation of silicon followed by a wet or dry etching process to form a recessed areas e.g., 36. For example the recessed areas may be formed with a depth, D corresponding to about ¼ to about ¾ of the maximum depth D2 of the SDE regions 14A.

Figure 3B:
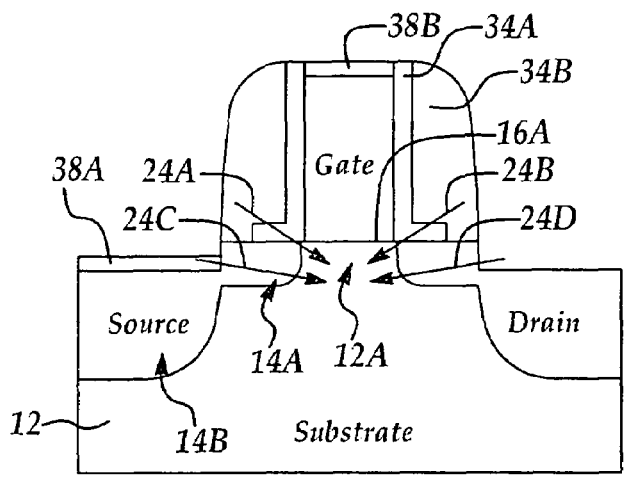

Referring to FIG. 3B, a conductive material is formed over the S/D regions and upper portion of the gate electrode. For example self aligned silicide (silicide) regions e.g., 38A and 38B are formed over the S/D regions and upper portion of gate electrode 16B according to the same preferred embodiments outlined for conductive regions e.g., 26A and 26B shown in FIG. 1E. According to this embodiment, stress vectors e.g., 24A, 243, 24C and 24D are directed with a more horizontally directed component in the plane of the substrate to induce a desired strain in the channel region 12A, thereby further improving charge carrier mobility and reducing short channel effect (SCE).

Figure 4:
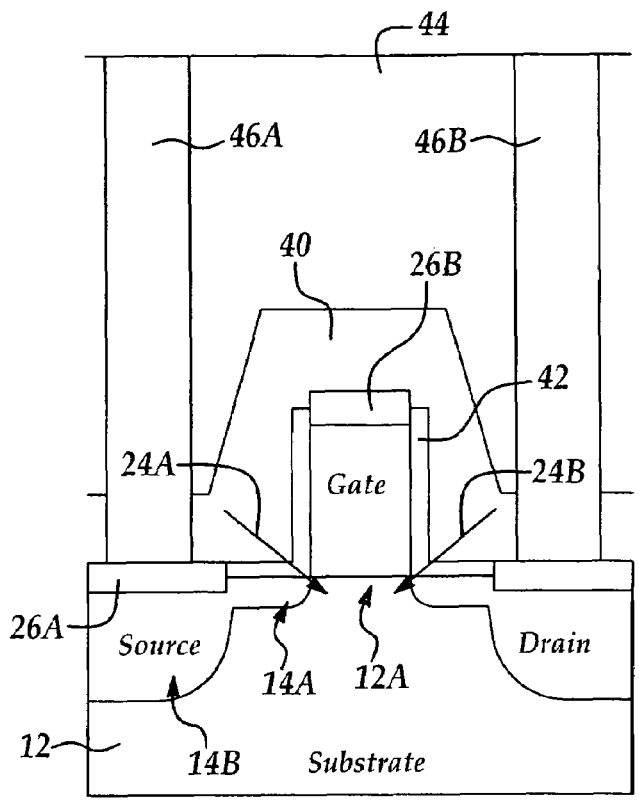
FIG. 4 is a cross sectional schematic representation of an exemplary CMOS semiconductor device at a stage of manufacture according to an embodiment of the present invention.

Referring to FIG. 4, in another embodiment a stressed dielectric layer is formed over the gate electrode and S/D regions to exert a stress on the channel region 12A. for example, following formation of the first pair of offset spacers, formation of the S/D regions e.g., 14B, and removal of the first set of offset spacers, a highly stressed dielectric layer e.g. 40 is formed over the gate electrode and S/D regions according to the same preferred embodiments discussed with respect to forming stressed dielectric layer 28. Offset liners e.g., 42 may be present along sides the gate electrode and conductive regions including silicides regions e.g., 26A and 26B may be formed as previously discussed. It will be appreciated that offset liner 42 may formed with an etched back portion exposing a portion of the semiconductor substrate 12 overlying the SDE regions e.g., 14A and/or formed with recessed regions e.g., 36 as shown in the embodiments in FIGS. 2 and 3. Conventional subsequent processes are then carried out to form integrated circuit wiring, for example depositing an overlying inter-layer dielectric (ILD) layer e.g., 44, for example PECVD silicon oxide, followed by planarization and conventional photolithographic patterning and etching process to form metal damascene contacts e.g., 46A and 46B, extending through the stressed dielectric layer 40 thickness, and backfilled with a metal, for example tungsten, to form electric contact wiring with the conductive regions e.g., 26A formed over the S/D regions e.g., 14B. The formation of the damascenes extending through the stressed dielectric layer 40 serves to more precisely define and direct a stress, e.g., stress vectors 24A and 24B, to induce a desired strain on the channel region 12A.

Figure 5:
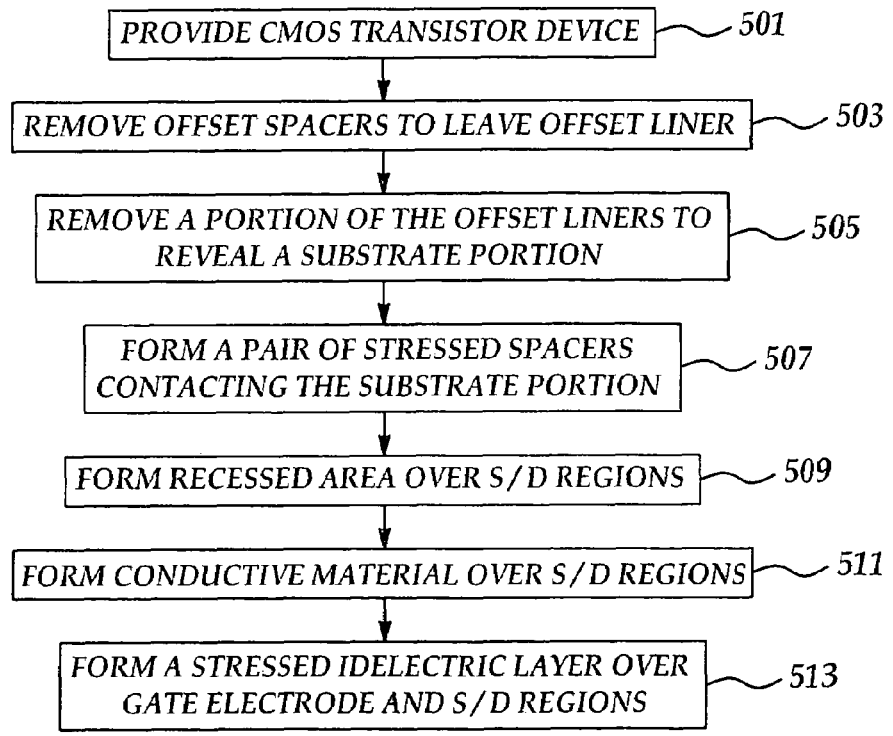
FIG. 5 is an exemplary process flow diagram including several embodiments of the present invention.

Referring to FIG. 5 is a process flow diagram including several embodiments of the present invention. In process 501, a CMOS device comprising a semiconductor substrate, a gate structure, a first pair of offset spacer liners and offset spacers is provided including SDE and S/D regions. In process 503, the first pair of offset spacers is removed to leave the offset liner. In process 505, a portion of the offset layer is removed to reveal a substrate portion. In process 507, a pair of stressed offset spacers having a high stress level of tensile or compressive stress is formed. In process 509, recessed areas are formed over the S/D regions. In process 511, conductive portions are formed over the S/D regions. In process 513, a stressed dielectric contact etch stop layer having a high stress level of tensile or compressive stress is formed (blanket deposited) over the gate electrode, stressed offset spacers and S/D region.

Thus a method has been presented for selectively delivering a selected strain in a CMOS transistor device to a channel region by forming mechanically stressed spacers following formation of SDE and S/D regions and removal of a first pair of spacers used for forming the S/D regions. Other embodiments include optional processes to achieve desired stress vectors to achieve a selected strain on the channel region including offset liner etchback to form the stressed spacers in contact with the semiconductor substrate overlying the SDE region and/or forming a recessed area over the S/D regions prior to forming the silicide portions to more effectively deliver a stress vector to the channel region. In addition, the formation of a stressed contact etching stop layer over the strained channel transistor device with or without the stressed spacers and optionally including offset liner etchback and/or S/D recessed area serves as an additional tool to modify a stress vector magnitude to achieve a desired strain in the channel region thereby improving charge carrier mobility and reducing short channel effects.

Advantageously, by forming the stresses spacers according to embodiments of the present invention, the unpredictable alteration in a stress level in the spacers by ion implantation and activation is avoided, thereby improving the stability, performance, and reliability of CMOS transistor operation.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A strained channel transistor comprising:
   a semiconductor substrate;
   a gate dielectric overlying a channel region;
   a gate electrode overlying the gate dielectric;
   source/drain extension (SDE) regions and source and drain (S/D) regions;
   an internally stressed pair of offset spacers disposed adjacent the sides of the gate electrode, said internal stress originating from within said offset spacers, wherein only a portion of a bottom surface portion of each of the pair of stressed offset spacers contacts the semiconductor substrate, said internal stress being compressive for a P charge mobility transistor or tensile for a N charge mobility transistor; and,
   an internally stressed dielectric layer disposed over the gate electrode, the internally stressed offset spacers, and the S/D regions, said internal stress originating from within said dielectric layer; wherein said stressed offset spacers and stressed dielectric layer are formed with a respective desired level of stress to cooperatively exert a desired strain on the channel region to improve said P or N charge mobility.

2. The strained channel transistor of claim 1, further comprising a pair of L-shaped offset liners disposed along the sides of the gate electrode.

3. The strained channel transistor of claim 1, further comprising respective recessed S/D regions underlying the stressed dielectric layer.

4. The strained channel transistor of claim 1, further comprising conductive regions disposed over the S/D regions.

5. The strained channel transistor of claim 1, wherein the stressed dielectric layer comprises a contact etching stop layer.

6. The strained channel transistor of claim 1, wherein the pair of stressed offset spacers and the stressed dielectric layer are formed of a material selected from the group consisting of silicon nitride, silicon oxynitride, silicon oxide, and combinations thereof.

7. The strained channel transistor of claim 1, wherein the desired stress level is up to about 2 GPa.

8. The strained channel transistor of claim 1, wherein the stressed dielectric layer is formed of a material selected from the group consisting of silicon nitride, silicon oxynitride, silicon oxide, and combinations thereof.

9. The strained channel transistor of claim 8, wherein the desired stress level is up to about 2 GPa.

10. The strained channel transistor of claim 1, wherein the gate dielectric is selected from the group consisting of silicon oxide, silicon oxynitride, silicon nitride, a high permittivity dielectric, and combinations thereof.

11. The strained channel transistor of claim 10, wherein the high permittivity dielectric is selected from the group consisting of transition metal oxides, rare earth metal oxides, and combinations thereof.

12. The strained channel transistor of claim 1, wherein the gate electrode comprises a material selected from the group consisting of metals, metal suicides, metal nitrides, doped polysilicon, and combinations thereof.

13. The strained channel transistor of claim 1, wherein the semiconductor substrate is selected from the group consisting of silicon, silicon on insulator (SOI), strained silicon, and silicon-germanium.

14. The strained channel transistor of claim 1, wherein the offset spacers have a positive radius of curvature at an outer portion.

15. A strained channel transistor comprising;
   an semiconductor substrate;
   a gate dielectric overlying a channel region;
   a gate electrode overlying the gate dielectric;
   recessed source and drain (S/D) regions disposed adjacent opposing sides of the channel region, said recessed (S/D) regions having an upper semiconductor substrate surface level below said gate dielectric level;
   a pair of internally stressed offset spacers each having a positive radius of curvature at an outer portion and is formed with said internal stress originating from within said offset spacers at a desired stress level, said offset spacers disposed adjacent the sides of the gate electrode, said internal stress being compressive for a P charge mobility transistor or tensile for a N charge mobility transistor; and,
   an internally stressed dielectric layer, said internal stress originating from within said dielectric layer, said dielectric layer disposed over the gate electrode, the stressed offset spacers, and the recessed S/D regions;

wherein said stressed dielectric layer and said stressed offset spacers to cooperatively exert a strain on the channel region to improve said P or N charge mobility.

16. The strained channel transistor of claim 15, further comprising conductive regions disposed over the S/D regions and underlying the stressed dielectric layer.

17. The strained channel transistor of claim 15, further comprising a pair of L-shaped offset liners disposed along the sides of the gate electrode.

18. A strained channel transistor comprising:
a semiconductor substrate;
a gate dielectric overlying a channel region;
a gate electrode overlying the gate dielectric;
source and drain (3/0) regions disposed on opposing sides of the channel region;
a pair of internally stressed offset spacers formed with said internal stress originating from within said offset spacers at a desired stress level, said offset spacers disposed adjacent the sides of the gate electrode such that only a portion of a bottom surface portion of said offset spacers contacts the semiconductor substrate, said internal stress being compressive for a P charge mobility transistor or tensile for a N charge mobility transistor; and,
an internally stressed dielectric layer formed with said internal stress originating from within said dielectric layer at a desired stress level, said dielectric layer disposed over the gate electrode including the pair of internally stressed offset spacers and the S/D regions;
wherein said stressed dielectric layer and said stressed offset spacers cooperatively exert a strain on the channel region to improve said P or N charge mobility.

19. The strained channel transistor of claim 18, further comprising conductive regions disposed over the S/D regions and underlying the stressed dielectric layer.

20. The strained channel transistor of claim 18, wherein the offset spacers have a positive radius of curvature at an outer portion.

21. The strained channel transistor of claim 18, further comprising a pair of L-shaped offset liners disposed along the sides of the gate electrode.

22. A strained channel transistor comprising:
a semiconductor substrate;
a gate dielectric overlying a channel region;
a gate electrode overlying the gate dielectric;
a pair of internally stressed offset spacers formed with said internal stress originating from within said offset spacers at a desired stress level, said stressed offset spacers disposed adjacent the sides of the gate electrode such that only a portion of a bottom surface portion of said offset spacers contacts the semiconductor substrate, said internal stress being compressive for a P charge mobility transistor or tensile for a N charge mobility, transistor;
source and drain (S/D) regions disposed on opposing sides of the channel region, said (S/D regions) recessed to have an upper semiconductor substrate surface level below the gate dielectric level; and,
an internally stressed dielectric layer formed with said internal stress originating from within said dielectric layer at a desired stress level, said dielectric layer disposed over the gate electrode, the stressed offset spacers, and the S/D regions;
wherein said stressed dielectric layer and said stressed offset spacers cooperatively exert a strain on the channel region to improve said P or N charge mobility.

23. The strained channel transistor of claim 22, further comprising conductive regions disposed over the S/D regions and underlying the stressed dielectric layer.

24. The strained channel transistor of claim 22, further comprising an L-shaped offset liner disposed on the sides of the gate electrode.

25. The strained channel transistor of claim 22, wherein the offset spacers have a positive radius of curvature at an outer portion.

* * * * *